United States Patent
Yamada et al.

(10) Patent No.: US 7,479,406 B1
(45) Date of Patent: Jan. 20, 2009

(54) BOTTOM HEATSLUG EPBGA FOR HIGH THERMAL PERFORMANCE

(75) Inventors: Yasuharu Yamada, Shiga (JP); Hiroji Yamamoto, Shiga (JP); Shinichi Harada, Ebina (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/048,989

(22) Filed: Mar. 14, 2008

(51) Int. Cl.
*H01L 21/00* (2006.01)

(52) U.S. Cl. ..................................... 438/106

(58) Field of Classification Search ......... 438/106–109; 257/706–712; 349/719
See application file for complete search history.

(56) References Cited

U.S. PATENT DOCUMENTS

| | | | |
|---|---|---|---|
| 5,642,261 A * | 6/1997 | Bond et al. | 361/704 |
| 5,757,073 A | 5/1998 | Hoffmeyer | |
| 5,870,289 A | 2/1999 | Tokuda et al. | |
| 6,833,613 B1 * | 12/2004 | Akram et al. | 257/686 |
| 7,038,311 B2 * | 5/2006 | Woodall et al. | 257/706 |
| 2008/0096312 A1 * | 4/2008 | Law et al. | 438/106 |

* cited by examiner

*Primary Examiner*—Nathan W Ha
(74) *Attorney, Agent, or Firm*—Cahn & Samuels, LLP

(57) ABSTRACT

A laminate circuit board package having a thermal heat spreader or heatslug thermally coupled to an electrical component such as an integrated circuit (IC) in order to dissipate heat within the IC by forming a heatpath away from the IC. The heat spreader is preferably formed of high performance thermal materials and thermally coupled to the IC. The heat spreader is configured to provide an enhanced thermal passage that efficiently facilitates the flow of heat away from the chip. The thermal heat spreader is coupled to the IC via one or more holes formed in the laminate board to efficiently disperse heat away from the chip and onto an attached motherboard.

1 Claim, 2 Drawing Sheets

BOTTOM HEATSLUG EPBGA FOR HIGH THERMAL PERFORMANCE

I. FIELD OF THE INVENTION

This invention relates to a laminate circuit board package having a thermal heat spreader below the chip to improve thermal dissipation within the chip. The thermal heat spreader is formed of high performance thermal materials such as cooper and attached through the holes of the circuit board to efficiently disperse heat away from the chip and onto an attached motherboard.

II. BACKGROUND OF THE INVENTION

Circuit board designs utilize various arrangements in an effort to improve thermal radiation of heat from the chip while reducing thermal resistance. These designs often attempt to release heat to the motherboard through numerous thermal through holes or vias formed in the laminate circuit board. Thermally conductive material is place in the through holes and attached to the chip. Balls of solder are attached to the opposite end of the thermally conductive material and heated such that the solder adheres to the motherboard thereby forming a conductive path for heat to flow from the chip to the motherboard. These through hole designs can be very complicated due to the large number and small size of the through holes.

Some circuit board configurations having built-in heat spreaders in the plastic mold portion of the board, called Thermally Enhanced—Enhanced Plastic Ball Grid Array or TE-EPBGA, have also been used. These configurations utilize wire bond packages having wires (often made of gold, Au) that extend out from around the die to the laminate board. Thus, even if a heatslug or dissipater is used with this configuration, the wires effectively limit the size of the heatslug to the size of the die. Resin is also used to fill in between the die and heatslug, thereby increasing thermal resistance.

There also exists a circuit board configuration having a heat spreader installed on the laminate surface and a chip attached, referred to as a High Performance Ball Grid Array or HPBGA. This configuration has good thermal radiation. However, the laminate and BGA process is complicated and very expensive.

III. SUMMARY OF THE INVENTION

In at least one embodiment the present invention provides a circuit board package for dissipating heat from a chip, including: a laminated board having at least one through hole formed therein; an integrated circuit coupled to said laminated board via a thermally conductive material; a thermally conductive heatslug coupled to said laminated board on a side opposite said integrated circuit, wherein said heatslug includes: at least one stepped portion disposed within at least one through hole in said laminated board and thermally coupled to said integrated circuit; and at least one substantially thin and flat peripheral portion that extends from said stepped portion and covers an area substantially the size of said integrated circuit.

In at least one other embodiment the present invention provides a method of making a circuit board package for dissipating heat from a chip, including providing a laminated board having at least one through hole formed therein; coupling an integrated circuit to said laminated board via a thermally conductive material; coupling a thermally conductive heatslug to said laminated board on a side opposite said integrated circuit, wherein said heatslug including at least one stepped portion disposed within at least one through hole in said laminated board and thermally coupled to said integrated circuit; and at least one substantially thin and flat peripheral portion that extends from said stepped portion and covers an area substantially the size of said integrated circuit.

An objective of the present invention is to provide thermal dissipation within an integrated circuit by forming a thermal heatpath that conducts heat away from the integrated circuit.

An advantage of the present invention is that integrated circuit may run at much cooler temperatures when compared to conventional Enhanced Plastic Ball Grid Array (EPBGA) packages.

IV. BRIEF DESCRIPTION OF THE DRAWINGS

The present invention is described with reference to the accompanying drawings, wherein.

Given the following enabling description of the drawings, the apparatus should become evident to a person of ordinary skill in the art.

V. DETAILED DESCRIPTION OF THE DRAWINGS

Figure 1:
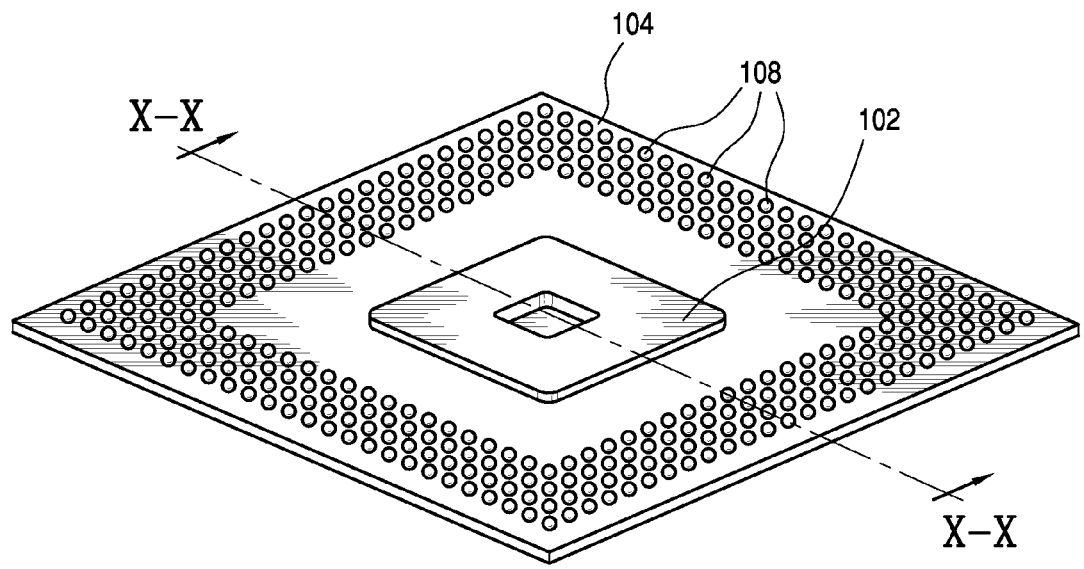
FIG. 1 illustrates a bottom view of the thermal heatslug arrangement in accordance with at least one exemplary embodiment of the present invention.

The present invention discloses an apparatus for cooling a laminate circuit board package having a thermal heat spreader disposed below an active electrical component such as an integrated circuit (IC) or chip to improve thermal dissipation within the chip by forming a thermal heatpath that conducts heat away from the chip. FIG. 1 illustrates a bottom view of the thermal heat spreader or heatslug 102 of the present invention. The heatslug 102 is coupled to a laminate board 104 having an Enhanced Plastic Ball Grid Array (EPBGA) 108 surface mount packaging used to mount the laminate board 104 to a printed circuit board (PCB) or motherboard.

Figure 2:
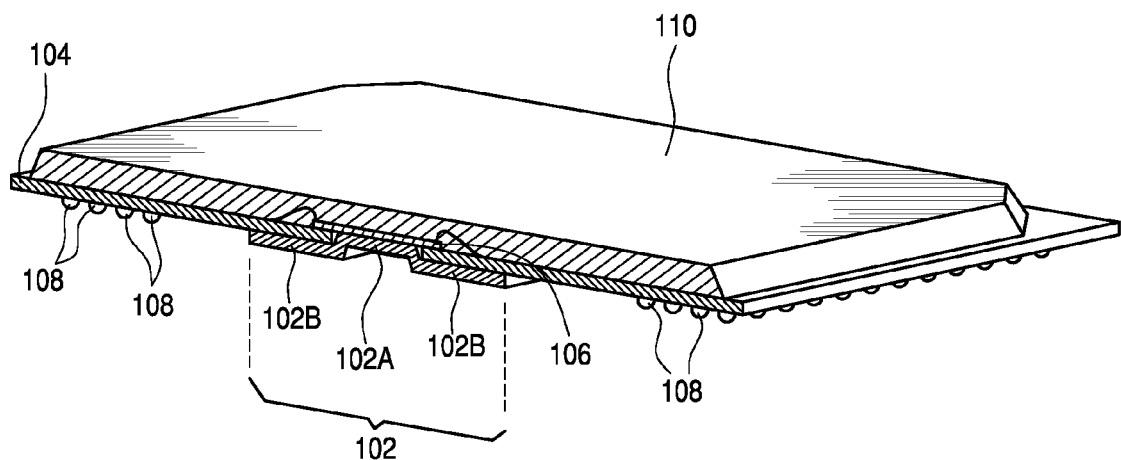
FIG. 2 illustrates a cross-sectional perspective view of the thermal heatslug arrangement taken at lines X-X as illustrated in FIG. 1 in accordance with an exemplary embodiment of the present invention.

FIG. 2 illustrates a cross-sectional perspective view of the present invention taken at lines X-X of FIG. 1. FIG. 2 shows the heatslug 102 mounted to laminate board 104. Heatslug 102 includes a stepped portion 102A and at least one relatively long and substantially flat peripheral portion that extends from said stepped portion 102A. The stepped portion 102A of the heatslug is disposed within a throughhole formed in the laminated board 104 and the peripheral portions 102B extend along the laminate board 104. An integrated circuit (IC) 110 is mounted on the opposite side of the laminate board 104 from the heatslug 102. The stepped portion 102A of the heatslug 102 is thermally coupled to the integrated circuit 110 via a thermal interface material 106. The stepped portion 102A includes a void on a side opposite the integrated circuit 110. The thermal interface material 106 and heatslug 102 forms a thermal heatpath that conducts heat away from the integrated circuit 110 and through the heatslug 102. Exemplary heaslug materials are Cu alloy C1100 having tin plating and a thermal conductivity of ~300 W/mK or Al alloy A1050 having tin plating and a thermal conductivity of approximately 200 W/mK. Exemplary thermal interface materials are thermal rubbers having a thermal conductivity of 0.8-3.0 W/mK and thermal grease having a thermal conductivity of 1.0-10.0 W/mK.

Figure 3:
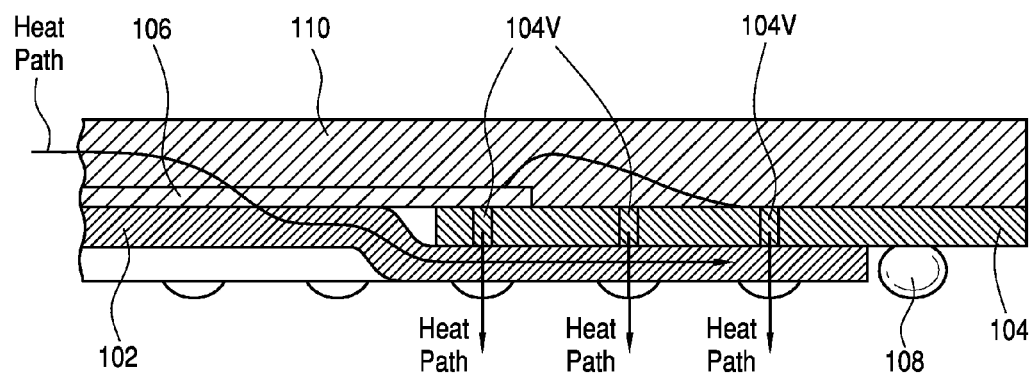
FIG. 3 illustrates a sectional side view of the thermal heatslug arrangement in accordance with an exemplary embodiment of the present invention.

FIG. 3 illustrates a sectional side view of the present invention. FIG. 3 shows the integrated circuit 110 mounted on the laminate board 104 with thermal interface material 106. The thermal interface material 106 couples the integrated circuit 110 to the heatslug 102. The thermal interface material 106 and heatslug 102 forms a heatpath (shown with arrow) that allows heat to flow away from the integrated circuit 110. Laminate board 104 also includes thermal vias 104V that promotes additional thermal dissipation within the integrated circuit 110. Thermal interface material 106 may be disposed within vias 104V to provide additional heatpaths from the integrated circuit 110 to heatslug 102.

Figure 4:
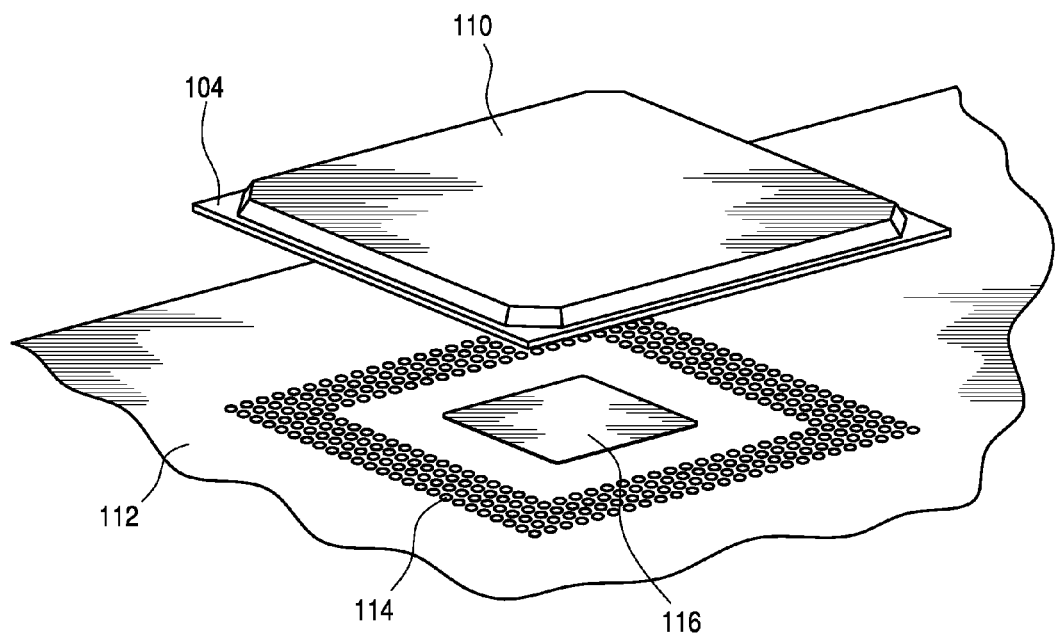
FIG. 4 illustrates a perspective view of the heatslug mounting arrangement in accordance with an exemplary embodiment of the present invention.

FIG. 4 illustrates a perspective view of the present invention prior to mounting on a motherboard. Integrated circuit 110 is mounted on laminate board 104 having a heatslug (not shown) as described above. Motherboard 112 includes a thermal ball mounting pad array 114 and a thermal interface material 116. The thermal ball mounting pad array 114 is designed to mate with the Enhanced Plastic Ball Grid Array (EPBGA) 108 from the laminate board 104. The thermal interface material 116 is placed on the motherboard 112 so as to be aligned with the heatslug 102 on the laminate board 104. The thermal interface material thermally couples the heatslug 102 to the motherboard 112 thereby forming a heatpath that allows heat to flow from the integrated circuit 110.

Mounting the integrated circuit 110 and laminate board 104 with heatslug 102 onto the motherboard 112 produces an integrated circuit package having improved thermal dissipation characteristics. The following test results more clearly illustrate the benefits of the present invention over conventional thermal ball mounting packages. Thermal testing of integrated circuit packages was performed on a conventional thermal ball mounting package and an Enhanced Plastic Ball Grid Array (EPBGA) with a bottom mounted heatslug package. Testing on both packages was performed under the listed conditions, as follows: natural convention, ambient temperature of 20 degrees Celsius; power consumption of 2 W; and a base side board JEDEC standard (JESD51-9) 2S2P with thermal via (outer layer 2 oz, inner layer 1 oz). The conventional thermal ball mounting package included a 40 mm Enhanced Plastic Ball Grid Array (EPBGA) with thermal balls only. The mounting package of the present invention included a 40 mm Enhanced Plastic Ball Grid Array (EPBGA) with a bottom mounted 0.3 mm heatslug made of copper, Cu. The maximum temperature of the integrated circuit of the conventional package was 49.29 degrees Celsius. Whereas, the maximum temperature of the integrated circuit package of the present invention was 42.64 degrees Celsius—some 6.65 degrees Celsius less than the temperature of the conventional package under identical conditions. The thermal resistance of the package of the present invention also was also reduced to 11.32 degrees C/W from 14.654 degrees C/W for the conventional package.

As used above "substantially," "generally," "relatively" and other words of degree are relative modifiers intended to indicate permissible variation from the characteristic so modified. It is not intended to be limited to the absolute value or characteristic which it modifies but rather possessing more of the physical or functional characteristic than its opposite, and preferably, approaching or approximating such a physical or functional characteristic.

Although the present invention has been described in terms of particular embodiments, it is not limited to those embodiments. Alternative embodiments, examples, and modifications which would still be encompassed by the invention may be made by those skilled in the art, particularly in light of the foregoing teachings.

Those skilled in the art will appreciate that various adaptations and modifications of the embodiments described above can be configured without departing from the scope and spirit of the invention. Therefore, it is to be understood that, within the scope of the appended claims, the invention may be practiced other than as specifically described herein.

We claim:

1. A method of making a circuit board package for dissipating heat from an integrated circuit, comprising:

providing a laminated board having at least one through hole formed therein;

providing multiple thermal vias in said laminated board around said at least one through hole;

coupling an integrated circuit to said laminated board via a thermally conductive material;

coupling a thermally conductive heatslug to said laminated board on a side opposite said integrated circuit, wherein said heatslug comprises:

at least one stepped portion disposed within said at least one through hole in said laminated board and thermally coupled to said integrated circuit, wherein said stepped portion includes a void on a side opposite said integrated circuit; and at least one substantially thin and flat peripheral portion that extends from said stepped portion and covers an area substantially the size of said integrated circuit, wherein said stepped portion, said peripheral portion, and said thermal vias form a thermal heatpath that conducts heat away from said integrated circuit and along said peripheral portion.

* * * * *